(12) United States Patent
Chen et al.

(10) Patent No.: US 12,400,716 B2
(45) Date of Patent: Aug. 26, 2025

(54) MEMORY CELL AND ARRAY STRUCTURE OF NON-VOLATILE MEMORY AND ASSOCIATED CONTROL METHOD

(71) Applicant: eMemory Technology Inc., Hsin-Chu (TW)

(72) Inventors: Hsueh-Wei Chen, Hsinchu County (TW); Wei-Chiang Ong, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 132 days.

(21) Appl. No.: 18/387,474

(22) Filed: Nov. 7, 2023

(65) Prior Publication Data
US 2024/0161833 A1 May 16, 2024

Related U.S. Application Data

(60) Provisional application No. 63/424,966, filed on Nov. 14, 2022.

(51) Int. Cl.
*G11C 16/10* (2006.01)
*G11C 7/06* (2006.01)
(Continued)

(52) U.S. Cl.
CPC ............. *G11C 16/26* (2013.01); *G11C 7/062* (2013.01); *G11C 7/065* (2013.01); *G11C 16/10* (2013.01); *G11C 16/12* (2013.01); *G11C 16/24* (2013.01); *G11C 16/28* (2013.01); *H10B 41/35* (2023.02); *H10D 30/6892* (2025.01); *G11C 2013/0042* (2013.01)

(58) Field of Classification Search
CPC . G11C 16/12; G11C 11/4074; G11C 11/4091; G11C 11/4093; G11C 11/4096; G11C 11/4099; G11C 16/14; G11C 16/26; G11C 7/062; G11C 7/065; G11C 16/24; G11C 16/28; G11C 13/004; G11C 16/10; G11C 2013/0042; H10B 41/35; H10D 30/687; H10D 30/6892
See application file for complete search history.

(56) References Cited

U.S. PATENT DOCUMENTS 7,889,553 B2 * 2/2011 Terzioglu ........... G11C 16/0425
257/315
8,592,886 B2 * 11/2013 Hsu ........................ H10B 41/60
257/315

(Continued)

*Primary Examiner* — Amir Zarabian
*Assistant Examiner* — Justin Bryce Heisterkamp
(74) *Attorney, Agent, or Firm* — WPAT, PC

(57) ABSTRACT

A memory cell is connected to a source line, a bit line, a word line, an assist gate line and an erase line. When a program action is performed, a weak programming procedure is first performed on the memory cell, and then a strong programming procedure is performed on the memory cell. When the weak programming procedure is performed, an on voltage is provided to the word line, a first program voltage is provided to the source line, a ground voltage is provided to the bit line, a first assist gate voltage is provided to the assist gate line, and a first erase line voltage is provided to the erase line. When the strong programming procedure is performed, a lower program voltage and a higher assist gate voltage are provided to the memory cell.

13 Claims, 5 Drawing Sheets

(51) Int. Cl.
*G11C 16/12* (2006.01)
*G11C 16/24* (2006.01)
*G11C 16/26* (2006.01)
*G11C 16/28* (2006.01)
*H10B 41/35* (2023.01)
*H10D 30/68* (2025.01)
*G11C 13/00* (2006.01)

(56) References Cited

U.S. PATENT DOCUMENTS

| | | |
|---|---|---|
| 8,941,167 B2 | 1/2015 | Chen et al. |
| 9,805,806 B2 | 10/2017 | Chen et al. |
| 11,282,844 B2 * | 3/2022 | Hsu ........................ H10B 41/10 |
| 11,508,425 B2 * | 11/2022 | Hsu ..................... G11C 11/1675 |
| 11,818,887 B2 * | 11/2023 | Chen ..................... H10B 41/60 |
| 2015/0001608 A1 * | 1/2015 | Tan ..................... H10D 30/681 |
| | | 257/321 |

* cited by examiner

MEMORY CELL AND ARRAY STRUCTURE OF NON-VOLATILE MEMORY AND ASSOCIATED CONTROL METHOD

This application claims the benefit of U.S. provisional application Ser. No. 63/424,966, filed Nov. 14, 2022, the subject matters of which are incorporated herein by references.

FIELD OF THE INVENTION

The present invention relates to a non-volatile memory, and more particularly to a memory cell and an array structure of a non-volatile memory and a control method of the non-volatile memory.

BACKGROUND OF THE INVENTION

As is well known, a non-volatile memory is able to continuously retain data after the supplied power is interrupted. Consequently, non-volatile memories have been widely applied to various electronic products. Generally, a non-volatile memory comprises an array structure. The array structure comprises plural memory cells in an array arrangement. In addition, each memory cell comprises a floating gate transistor.

For example, an erasable programmable single-poly non-volatile memory was disclosed in U.S. Pat. No. 8,941,167. FIG. 1 is a schematic equivalent circuit diagram of a conventional non-volatile memory cell. For brevity, the memory cell of the non-volatile memory will be referred as a memory cell.

As shown in FIG. 1, the conventional memory cell comprises a select transistor $M_S$, a floating gate transistor $M_F$, and two metal-oxide-semiconductor capacitors $C_{MOS1}$ and $C_{MOS2}$. Hereinafter, the metal-oxide-semiconductor capacitors are also referred as MOS capacitors. Moreover, since this memory cell comprises two transistors and two capacitors, this memory cell is also referred as a 2T2C memory cell.

The select transistor $M_S$ and the floating gate transistor $M_F$ are constructed in a first N-well region NW1. The select transistor $M_S$ and the floating gate transistor $M_F$ are p-type transistors. The first MOS capacitor $C_{MOS1}$ is a p-type transistor and constructed in a second N-well region NW2. In addition, the two drain/source terminals of this p-type transistor are connected with each other and collaboratively formed as an erase gate region 45. The first N-well region NW1 receives a first N-well voltage $V_{NW1}$. The second N-well region NW2 receives a second N-well voltage $V_{NW2}$. The P-well region PW receives a P-well voltage $V_{PW}$. The second MOS capacitor $C_{MOS2}$ is an n-type transistor and constructed in a P-well region PW. In addition, the two drain/source terminals of this n-type transistor are connected with each other and collaboratively formed as an assist gate region 55. In other words, the body terminal of the select transistor $M_S$ and the body terminal of the floating gate transistor $M_F$ receives the first N-well voltage $V_{NW1}$, the body terminal of the p-type transistor receives the second N-well voltage $V_{NW2}$, and the body terminal of the n-type transistor receives the P-well voltage $V_{PW}$.

Please refer to FIG. 1 again. The first drain/source terminal of the select transistor $M_S$ is connected to a source line SL to receive a source line voltage $V_{SL}$. The gate terminal of the select transistor $M_S$ is connected to a select gate line to receive a select gate voltage $V_{SG}$. The first drain/source terminal of the floating gate transistor $M_F$ is connected to the second drain/source terminal of the select transistor $M_S$. The second drain/source terminal of the floating gate transistor $M_F$ is connected to a bit line to receive a bit line voltage VEL. The first terminal of the first MOS capacitor $C_{MOS1}$ is connected to a floating gate 36 of the floating gate transistor $M_F$. The second terminal of the first MOS capacitor $C_{MOS1}$ is connected to an erase line to receive an erase line voltage VEL. The first terminal of the second MOS capacitor $C_{MOS2}$ is connected to the floating gate 36 of the floating gate transistor $M_F$. The second terminal of the second MOS capacitor $C_{MOS2}$ is connected to an assist gate line to receive an assist gate voltage $V_{AG}$.

By providing proper bias voltages as the select gate voltage $V_{SG}$, the source line voltage $V_{SL}$, the bit line voltage $V_{BL}$, the erase line voltage $V_{EL}$, the assist gate voltage $V_{AG}$, the first N-well voltage $V_{NW1}$, the second N-well voltage $V_{NW2}$ and the P-well voltage $V_{PW}$, a program action, an erase action or a read action can be selectively performed on the non-volatile memory cell.

In the conventional 2T2C memory cell, the two drain/terminals of the p-type transistors are connected with each other, and the p-transistor is formed as the first MOS capacitor $C_{MOS1}$. In addition, the two drain/terminals of the n-type transistors are connected with each other, and the n-transistor is formed as the second MOS capacitor $C_{MOS2}$. Consequently, during the process of manufacturing the p-type transistor and the n-transistor, it is necessary to perform a p-type doping process on the erase gate region 45 and perform an n-type doping process on the assist gate region 55. In other words, the manufacturing process of the conventional 2T2C memory cell is complicated. Moreover, when the program action, the erase action or the read action is performed, it is necessary to provide so many bias voltages to the memory cell. For example, three well voltages $V_{NW1}$, $V_{NW2}$ and $V_{PW}$ are provided to the memory cell.

SUMMARY OF THE INVENTION

An embodiment of the present invention provides a control method for a memory cell of a non-volatile memory. The memory cell includes a select transistor, a floating gate transistor, a first capacitor and a second capacitor. A first drain/source terminal of the select transistor is connected to a source line. A gate terminal of the select transistor is connected to a word line. A first drain/source terminal of the floating gate transistor is connected to a second drain/source terminal of the select transistor. A second drain/source terminal of the floating gate transistor is connected to a bit line. The first capacitor is connected between a floating gate of the floating gate transistor and an erase line. The second capacitor is connected between the floating gate of the floating gate transistor and an assist gate line. The control method includes the following steps. Firstly, a weak programming procedure of a program action is performed on the memory cell. When the weak programming procedure is performed, the select transistor is turned on, a first program voltage is provided to the source line, a ground voltage is provided to the bit line, a first assist gate voltage is provided to the assist gate line, and a first erase line voltage is provided to the erase line. Then, a strong programming procedure of the program action is performed on the memory cell after the weak programming procedure is completed. When the strong programming procedure is performed, the select transistor is turned on, a second program voltage is provided to the source line, the ground voltage is provided to the bit line, a second assist gate voltage is provided to the assist gate line, and a second erase line voltage is provided to the erase line. The weak programming procedure is performed for a first programming time period. The strong programming procedure is performed for a second programming time period. The first program voltage is higher than the second program voltage. The first assist gate voltage is lower than the second assist gate voltage. The first programming time period is shorter than the second programming time period.

Another embodiment of the present invention provides a control method for an array structure of a non-volatile memory. The array structure includes x memory cells, and the x memory cells are divided into y groups, wherein x and y are positive integers larger than 1, and x is larger than or equal to y. The control method includes the following step. In a step (a), y weak programming procedures of a program action are performed sequentially. In addition, each of the y weak programming procedures is performed on the corresponding group. In a step (b), after the y weak programming procedures are completed, a strong programming procedure of the program action is performed on the x memory cells. A first memory of the x memory cells includes a select transistor, a floating gate transistor, a first capacitor and a second capacitor. A first drain/source terminal of the select transistor is connected to a source line. A gate terminal of the select transistor is connected to a first word line. A first drain/source terminal of the floating gate transistor is connected to a second drain/source terminal of the select transistor. A second drain/source terminal of the floating gate transistor is connected to a first bit line. The first capacitor is connected between a floating gate of the floating gate transistor and an erase line. The second capacitor is connected between the floating gate of the floating gate transistor and a first assist gate line. When the weak programming procedure is performed on the first memory cell, the select transistor is turned on, a first program voltage is provided to the source line, a ground voltage is provided to the first bit line, a first assist gate voltage is provided to the first assist gate line, and a first erase line voltage is provided to the erase line. When the strong programming procedure is performed on the first memory cell, the select transistor is turned on, a second program voltage is provided to the source line, the ground voltage is provided to the first bit line, a second assist gate voltage is provided to the first assist gate line, and a second erase line voltage is provided to the erase line. Each of the y weak programming procedures is performed for a first programming time period. The strong programming procedure is performed for a second programming time period. The first program voltage is higher than the second program voltage. The first assist gate voltage is lower than the second assist gate voltage. The first programming time period is shorter than the second programming time period.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention provides a memory cell and an array structure of a non-volatile memory and a control method of the non-volatile memory. The memory cell is a 2T2C memory cell with a novel structure. Furthermore, the present invention provides a multi-procedure programming control method for performing a program action on the 2T2C memory cell. Consequently, the state of the memory cell can be switched from an erase state to a program state.

Figure 2A:
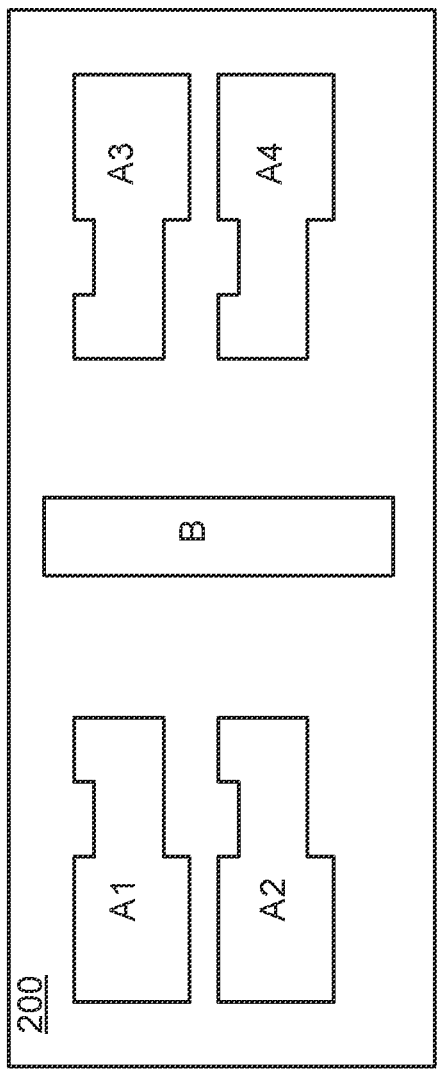
FIGS. 2A to 2E schematically illustrate the steps of a method of manufacturing an array structure of a non-volatile memory cell according to an embodiment of the present invention.
Figure 2B:
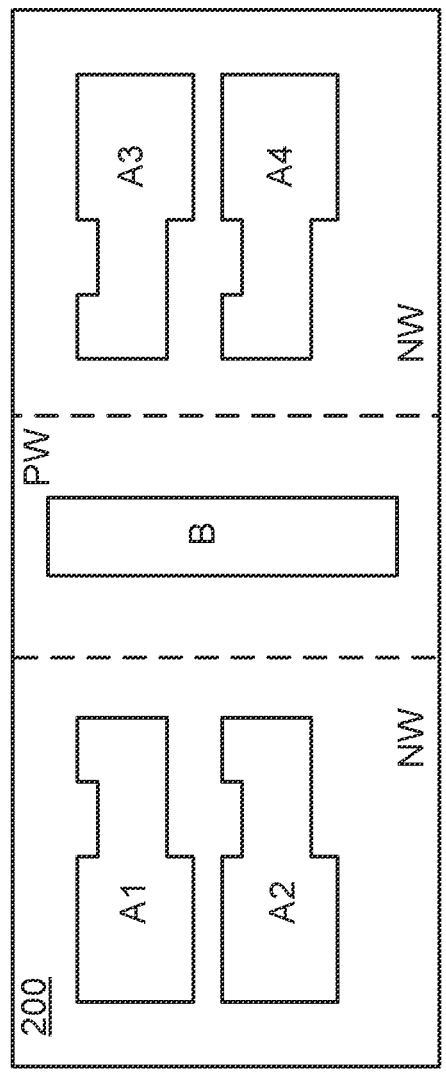
Figure 1:
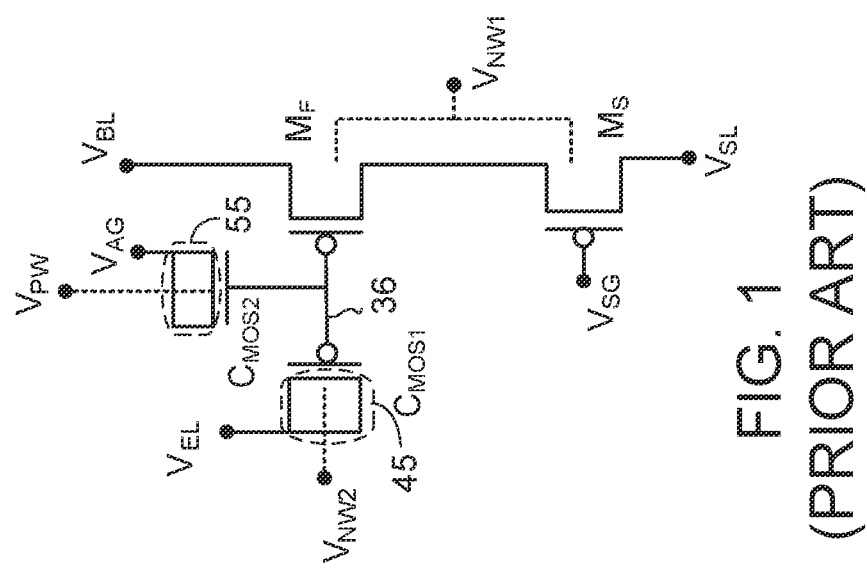
FIG. 1 (prior art) is a schematic equivalent circuit diagram of a conventional non-volatile memory cell.
Figure 2C:
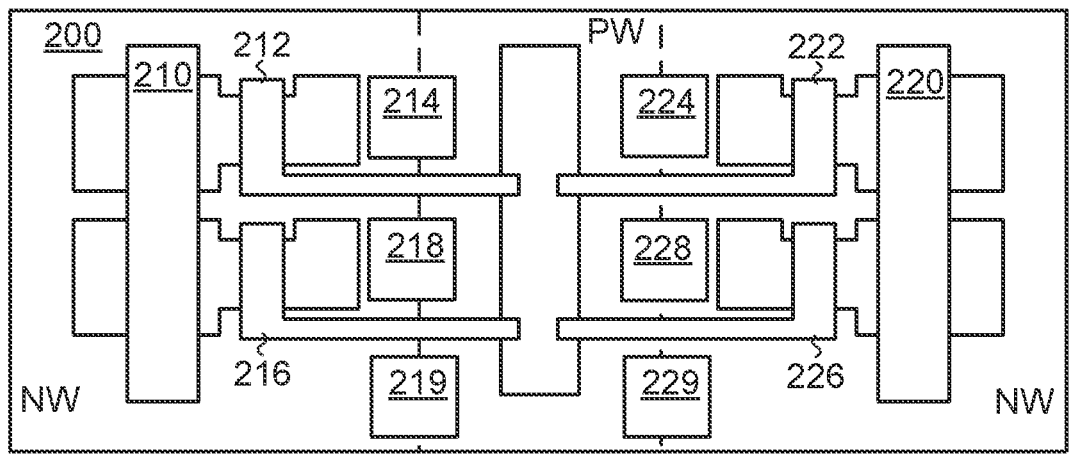
Figure 2D:
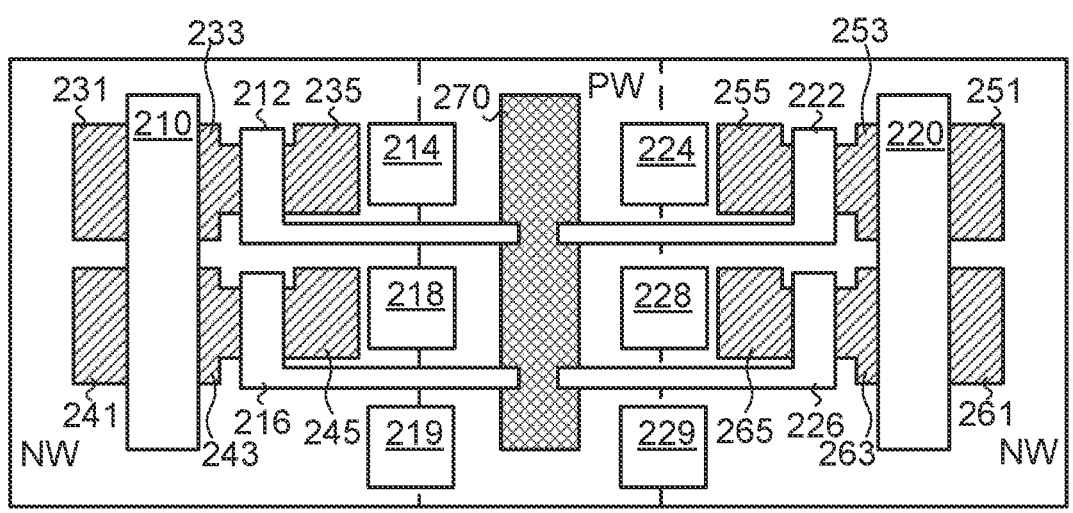

FIGS. 2A to 2E schematically illustrate the steps of a method of manufacturing an array structure of a non-volatile memory cell according to an embodiment of the present invention. FIG. 2F is a schematic equivalent circuit diagram of the array structure of the non-volatile memory cell according to the embodiment of the present invention. The array structure comprises m×n memory cells, wherein m and n are positive integers. For illustration, the array structure of this embodiment comprises 2×2 memory cells. Of course, the size of the array structure may be designed according to the practical requirements.

Firstly, an isolation structure forming step is performed. As shown in FIG. 2A, an isolation structure such as a shallow trench isolation (STI) structure 200 is formed on a surface of a semiconductor substrate. Due to the STI structure 200, four regions A1~A4 and a region B are defined. The surface of the semiconductor substrate corresponding to the regions A1~A4 and the region B is exposed. In the subsequent steps, serially-connected p-type transistors will be formed in the regions A1~A4, and an erase gate region is formed in the region B.

Then, a well region forming step is performed. As shown in FIG. 2B, an N-well region NW and a P-well region PW are formed under the surface of the semiconductor substrate.

The regions A1~A4 are located over the surface of the N-well region NW. The region B is located over the surface of the P-well region PW. It is noted that numerous modifications and alterations may be made while retaining the teachings of the invention. For example, in another embodiment, the isolation structure forming step and the well region forming step are exchanged. For example, the well region forming step is formed under the surface of the semiconductor substrate before the isolation structure forming step is performed.

Optionally, a p-type lightly doped region is formed in the P-well region PW. Consequently, the region B is located over the surface of the p-type lightly doped region. In addition, the p-type lightly doped region may be regarded as a part of the P-well region PW.

Then, a gate structure forming step is performed. As shown in FIG. 2C, plural gate structures 210, 212, 214, 216, 218, 219, 220, 222, 224, 226, 228 and 229 are formed over the semiconductor substrate. Each of the gate structures 210, 212, 214, 216, 218, 219, 220, 222, 224, 226, 228 and 229 comprises a gate dielectric layer and a gate layer. For example, the gate layer is a polysilicon gate layer. Moreover, the gate dielectric layer is covered by the gate layer.

As shown in FIG. 2C, the surface of the region A1 is divided into three parts by the two gate structures 210 and 212. Moreover, the gate structure 212 is externally extended to the region over the region B. The gate structure 214 is located over the isolation structure 200 and located beside the extension segment of the gate structure 212. Similarly, the surface of the region A2 is divided into three parts by the two gate structures 210 and 216. Moreover, the gate structure 216 is externally extended to the region over the region B. The gate structure 218 is located over the isolation structure 200. In addition, the gate structure 218 is arranged between the extension segment of the gate structure 212 and the extension segment of the gate structure 216. The gate structure 219 is located over the isolation structure 200 and located beside the extension segment of the gate structure 216.

Please refer to FIG. 2C again. The surface of the region A3 is divided into three parts by the two gate structures 220 and 222. Moreover, the gate structure 222 is externally extended to the region over the region B. The gate structure 224 is located over the isolation structure 200 and located beside the extension segment of the gate structure 222. Similarly, the surface of the region A4 is divided into three parts by the two gate structures 220 and 226. Moreover, the gate structure 226 is externally extended to the region over the region B. The gate structure 228 is located over the isolation structure 200. In addition, the gate structure 228 is arranged between the extension segment of the gate structure 222 and the extension segment of the gate structure 226. The gate structure 229 is located over the isolation structure 200 and located beside the extension segment of the gate structure 226.

Then, a doped region forming step is performed. As shown in FIG. 2D, a doping process is performed on the surface of the surface of the N-well region NW by using the gate structures 210, 212, 216, 220, 222 and 226 as the masks. Consequently, the portions of the regions A1~A4 uncovered by the gate structures 210, 212, 216, 220, 222 and 226 are formed as p-type doped regions 231, 233, 235, 241, 243, 245, 251, 253, 255, 261, 263 and 265.

Furthermore, a doping process is performed on the surface of the surface of the P-well region PW by using the gate structures 212, 216, 222 and 226 as the masks. Consequently, the portion of the region B uncovered by the gate structures 212, 216, 222 and 226 is formed as an n-type doped region 270.

Figure 2E:
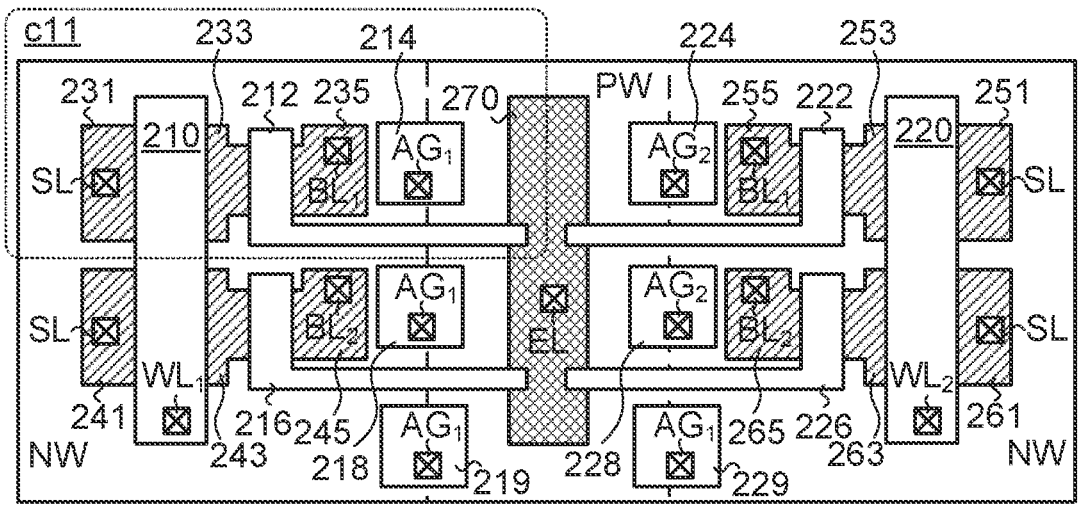
Figure 2F:
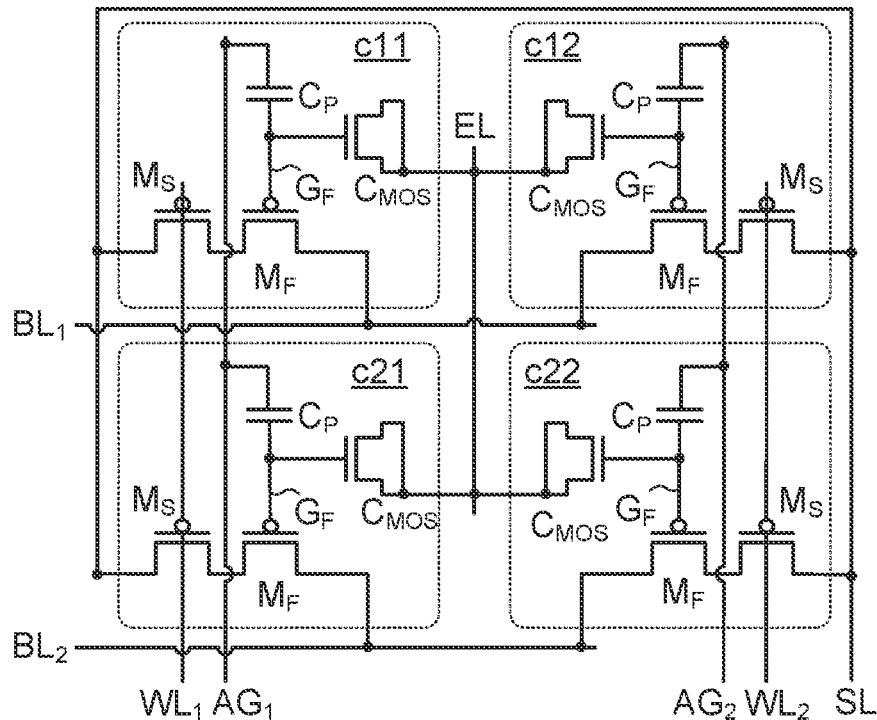
FIG. 2F is a schematic equivalent circuit diagram of the array structure of the non-volatile memory cell according to the embodiment of the present invention.

Please refer to FIG. 2E. After a line connection process is completed, an array structure is produced. In the array structure, the p-type doped regions 231, 241, 251 and 261 are connected to a source line SL, the p-type doped regions 235 and 255 are connected to a bit line $BL_1$, and the p-type doped regions 245 and 265 are connected to a bit line $BL_2$. In addition, the n-type doped region 270 is connected to an erase line EL, the gate layer of the gate structure 210 is connected to a word line $WL_1$, and the gate layer of the gate structure 220 is connected to a word line $W_{L2}$. In addition, the gate layers of the gate structures 214, 218 and 219 are connected to an assist gate line $AG_1$, and the gate layers of the gate structures 224, 228 and 229 are connected to an assist gate line $AG_2$.

As shown in FIG. 2E, the array structure comprises four memory cells. The structures of these memory cells are identical. For succinctness, only the structure of the memory cell c11 will be described as follows. The N-well region NW, the p-type doped region 231, the p-type doped region 233 and the gate structure 210 are collaboratively formed as a p-type select transistor. The N-well region NW, the p-type doped region 233, the p-type doped region 235 and the gate structure 212 are collaboratively formed as a p-type floating gate transistor. The P-well region PW, the n-type doped region 270 and the gate structure 212 are collaboratively formed as an n-type transistor, and the n-type transistor is connected as an n-type MOS capacitor. The gate layer of the gate structure 212 and the gate layer of the gate structure 214 are collaboratively formed as a lateral-coupling plate capacitor. Since the gate layer of the gate structure 212 and the gate layer of the gate structure 214 are polysilicon gate layers, the plate capacitor may be referred as a polysilicon/polysilicon capacitor.

The equivalent circuit of the array structure is shown in FIG. 2F. The array structure comprises four memory cells c11~c22. The structures of these memory cells c11~c22 are identical. The connecting relationships between associated components of the memory cells c11 will be described as follows. The first drain/source terminal of the select transistor $M_S$ is connected to the source line SL. The gate terminal of the select transistor $M_S$ is connected to the word line $WL_1$. The first drain/source terminal of the floating gate transistor $M_F$ is connected to the second drain/source terminal of the select transistor $M_S$. The second drain/source terminal of the floating gate transistor $M_F$ is connected to the bit line $BL_1$. The first terminal of the MOS capacitor $C_{MOS}$ is connected to the floating gate $G_F$ of the floating gate transistor $M_F$. The second terminal of the MOS capacitor $C_{MOS}$ is connected to the erase line EL. The first terminal of the plate capacitor $C_P$ is connected to the floating gate $G_F$ of the floating gate transistor $M_F$. The second terminal of the plate capacitor $C_P$ is connected to the assist gate line $AG_1$.

As mentioned above, the memory cell is a 2T2C memory cell comprising two transistors and two capacitors. One of the two capacitors is an n-type MOS capacitor, and the other capacitor is a plate capacitor. It is noted that numerous modifications and alterations may be made while retaining the teachings of the invention. For example, in a variant example, the n-type MOS capacitor is replaced by a p-type MOS capacitor.

In another variant example, the plate capacitor of the memory cell is a combination of plural plate capacitors in parallel connection. For example, in the memory cell c11 shown in FIG. 2E, the gate layer of the gate structure 212 and the gate layer of the gate structure 218 are collaboratively formed as another lateral-coupling plate capacitor, which is also a polysilicon/polysilicon capacitor. That is, in the memory cell c11, the plate capacitor between the floating gate $G_F$ of the floating gate transistor $M_F$ and the assist gate line $AG_1$ comprises plural plate capacitors in parallel connection.

In another variant example, a metal layer of the assist gate line $AG_1$ and the gate layer of the gate structure 212 are collaboratively formed as a vertical-coupling plate capacitor. The vertical-coupling plate capacitor is a polysilicon/metal capacitor. That is, in the memory cell c11, the plate capacitor between the floating gate $G_F$ of the floating gate transistor $M_F$ and the assist gate line $AG_1$ comprises plural plate capacitors in parallel connection.

Generally, when a memory cell comprising the p-type floating gate transistor $M_F$ is subjected to an erase action and the memory cell is switched to an erase state, an over-erase condition possibly occurs. That is, after the erase action is completed, excessive electrons are ejected from the floating gate $G_F$ of the p-type floating gate transistor $M_F$. In the over-erase condition, it is difficult to turn on the p-type floating gate transistor $M_F$. When the over-erased memory cell is subjected to a program action, the p-type floating gate transistor $M_F$ is possibly unable to be turned on. Under this circumstance, the memory cell cannot generate a program current. Since electrons are unable to be injected into the floating gate of the floating gate transistor $M_F$, the program action fails. In other words, the memory cell cannot be switched to the program state successfully.

For overcoming the above drawbacks, the present invention provides a multi-procedure programming control method for the 2T2C memory cell. Consequently, the program action can be effectively performed on memory cell. Hereinafter, a two-procedure programming control method will be taken as an example of the multi-procedure programming control method for illustration.

Figure 3A:
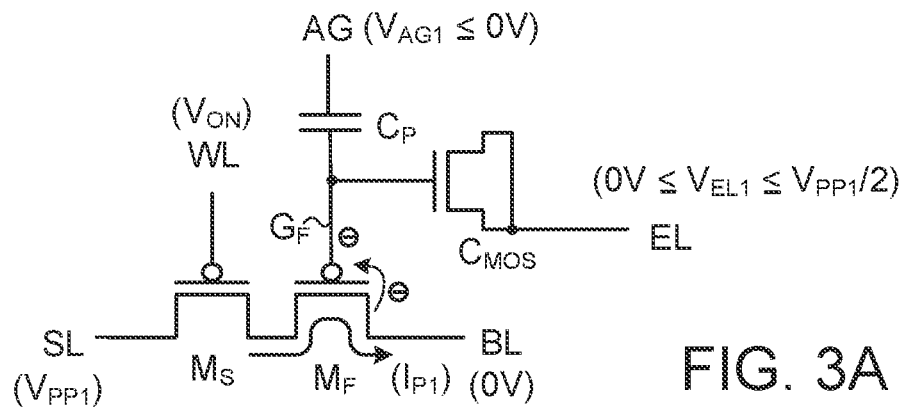
FIG. 3A is a schematic circuit diagram illustrating the bias voltage of performing a first programming procedure on the memory cell according to the embodiment of the present invention.

FIG. 3A is a schematic circuit diagram illustrating the bias voltages of performing a first programming procedure on the memory cell according to the embodiment of the present invention. The first programming procedure is a weak programming procedure for avoiding the over-erase condition of the memory cell. It takes a first programming time period for performing the first programming procedure. When the first programming procedure of the program action is performed, an on voltage $V_{ON}$ is provided to the word line WL, a first program voltage $V_{PP1}$ is provided to the source line SL, a ground voltage (0V) is provided to the bit line BL, a first erase line voltage $V_{EL1}$ is provided to the erase line EL, and a first assist gate voltage $V_{AG1}$ is provided to the assist gate line AG. In addition, the first program voltage $V_{PP1}$ is provided to the N-well region NW, and the ground voltage (0V) is provided to the P-well region PW. For example, the first erase line voltage $V_{EL1}$ is in the range between 0V and $V_{PP1}/2$, and the first assist gate voltage $V_{AG1}$ is lower than or equal to 0V. For example, the first assist gate voltage $V_{AG1}$ is in the range between −15V and 0V.

Figure 3B:
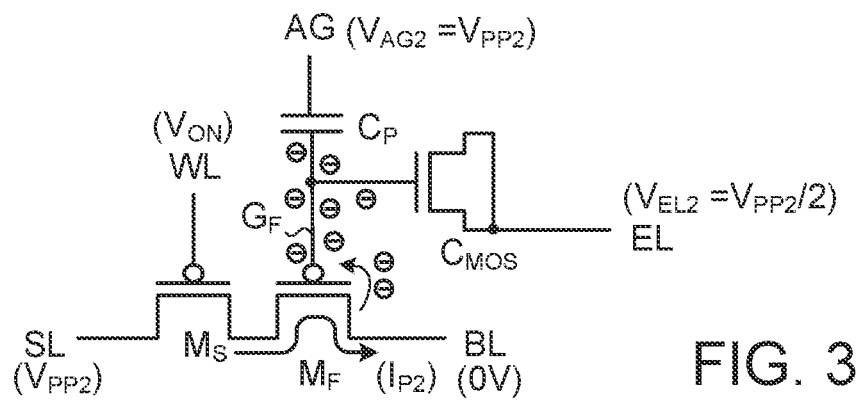
FIG. 3B is a schematic circuit diagram illustrating the bias voltage of performing a second programming procedure on the memory cell according to the embodiment of the present invention.

FIG. 3B is a schematic circuit diagram illustrating the bias voltages of performing a second programming procedure on the memory cell according to the embodiment of the present invention. The second programming procedure is a strong programming procedure for efficiently injecting electrons into the floating gate of the memory cell. It takes a second programming time period for performing the second programming procedure. When the second programming procedure of the program action is performed, the on voltage $V_{ON}$ is provided to the word line WL, a second program voltage $V_{PP2}$ is provided to the source line SL, the ground voltage (0V) is provided to the bit line BL, a second erase line voltage $V_{EL2}$ is provided to the erase line EL, and a second assist gate voltage $V_{AG2}$ is provided to the assist gate line AG. In addition, the second program voltage $V_{PP2}$ is provided to the N-well region NW, and the ground voltage (0V) is provided to the P-well region PW. For example, the second erase line voltage $V_{EL2}$ is equal to $V_{PP2}/2$, and the second assist gate voltage $V_{AG2}$ is equal to $V_{PP2}$.

In this embodiment, the first programming time period is shorter than the second programming time period. For example, the first programming time period is 3 μs, and the second programming time period is 38 μs. The first program voltage $V_{PP1}$ is higher than the second program voltage $V_{PP2}$. For example, the first program voltage $V_{PP1}$ is 7.5V, and the second program voltage $V_{PP2}$ is 6.25V. The first assist gate voltage $V_{AG1}$ is lower than the second assist gate voltage $V_{AG2}$. The select transistor $M_S$ in the memory cell is turned on in response to the on voltage $V_{ON}$. For example, the on voltage $V_{ON}$ is equal to $V_{PP1}/2$ or $V_{PP2}/2$. In an embodiment, the on voltage $V_{ON}$ is equal to $V_{PP1}/2$ when the weak programming procedure is performed, and the on voltage $V_{ON}$ is equal to $V_{PP2}/2$ when the strong programming procedure is performed.

Please refer to FIG. 3A again. When the first programming procedure (i.e., the weak programming procedure) is performed, the lower first assist gate voltage $V_{AG1}$ is coupled to the floating gate $G_F$ of the floating gate transistor $M_F$. Consequently, the floating gate transistor $M_F$ is turned on. In addition, the select transistor $M_S$ is turned on. The first drain/source terminal of the floating gate transistor $M_F$ receives the higher first program voltage $V_{PP1}$, and the second drain/source terminal of the floating gate transistor $M_F$ (or the bit line BL) receives the ground voltage. Consequently, a larger electric field between the two drain/source terminals of the floating gate transistor $M_F$ is generated. In the shorter first programming time period, the floating gate transistor $M_F$ generates a first program current $I_{P1}$. In addition, a channel hot electron (CHE) injection effect is generated. Due to the CHE injection effect, a small number of electrons are injected into the floating gate $G_F$ of the floating gate transistor $M_F$. Consequently, the memory cell is not in the over-erase condition.

Please refer to FIG. 3B again. When the second programming procedure (i.e., the strong programming procedure) is performed, the select transistor $M_S$ is turned on. Consequently, the first drain/source terminal of the floating gate transistor $M_F$ receives the second program voltage $V_{PP2}$, and the second drain/source terminal of the floating gate transistor $M_F$ (or the bit line BL) receives the ground voltage. Consequently, the floating gate transistor $M_F$ generates a second program current $I_{P2}$, and the CHE injection effect is generated. In addition, the higher second assist gate voltage $V_{AG2}$ is coupled to the floating gate $G_F$ of the floating gate transistor $M_F$. Since more electrons are attracted to the floating gate $G_F$ of the floating gate transistor $M_F$, the programming efficiency of the memory cell is enhanced. In the longer second programming time period, a great number of electrons are injected into the floating gate $G_F$ of the floating gate transistor $M_F$. Consequently, the memory cell is switched to the program state successfully.

As mentioned above, when the program action is performed on the 2T2C, the weak programming procedure is first performed. In the shorter first programming time period, the higher first program voltage $V_{PP1}$ and the lower first assist gate voltage $V_{AG1}$ are provided to control the memory cell. Consequently, a small number of electrons are injected into the floating gate $G_F$ of the floating gate transistor $M_F$. Then, the strong programming procedure is performed. In the longer second programming time period, the lower second program voltage $V_{PP2}$ and the higher second assist gate voltage $V_{AG2}$ are provided to control the memory cell. Consequently, a great number of electrons are injected into the floating gate $G_F$ of the floating gate transistor $M_F$. Since the second program voltage $V_{PP2}$ is lower, the power consumption during the program action is reduced.

In the above embodiment, the multi-procedure programming control method is a two-procedure programming control method. It is noted that the programming control method may include more than two programming procedures. For example, when the program action is performed, plural weak programming procedures are first performed to avoid the over-erase condition, and then a strong programming procedure is performed.

In the above embodiment, the programming control method is applied to a single memory cell. Of course, the programming control method of the present invention can be applied to the program action on plural memory cells of an array structure. For example, the programming control method is applied to a byte program action. That is, the programming control method can be used in the program action of programming eight memory cells simultaneously.

Figure 4A:
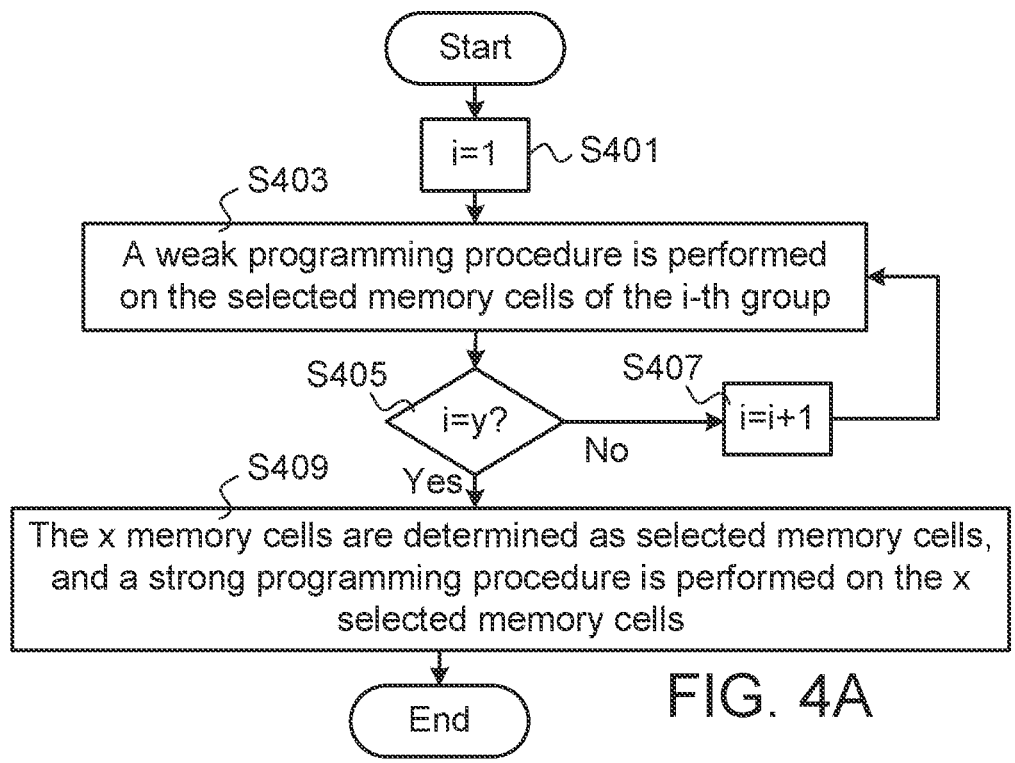
FIG. 4A is a flowchart of a programming control method for plural memory cells according to an embodiment of the present invention.

FIG. 4A is a flowchart of a programming control method for plural memory cells according to an embodiment of the present invention. When x memory cells in the array structure are subjected to the program action, the x memory cells are divided into y groups, wherein x is larger than or equal to y, and x and y are positive integer larger than 1. Moreover, each group comprises at least one memory cell. When the program action is performed, y weak programming procedures are sequentially performed on the corresponding groups of memory cells. After the y weak programming procedures are completed, a strong programming procedure is performed on all of the x memory cells.

Firstly, set i=1 (Step S401). Then, a weak programming procedure is performed on the selected memory cells of the i-th group (Step S403). In the steps S403, i is a positive integer.

Then, a step S405 is performed to judge whether i is equal to y. If the judging condition of the step S405 is not satisfied, it means that some memory cells have not be subjected to the weak programming procedure. Then, i is added by 1 (Step S407), and the step S403 is repeatedly done. Whereas, if the judging condition of the step S405 is satisfied, it means that the weak programming procedure has been performed y times. That is, all of the x memory cells have been subjected to the weak programming procedures. Then, the x memory cells are determined as selected memory cells, and a strong programming procedure is performed on the x selected memory cells (Step S409).

For understanding the concepts of the present invention, the programming control method of FIG. 4A applied to a byte program action will be described as follows.

Figures 4B, 4C:
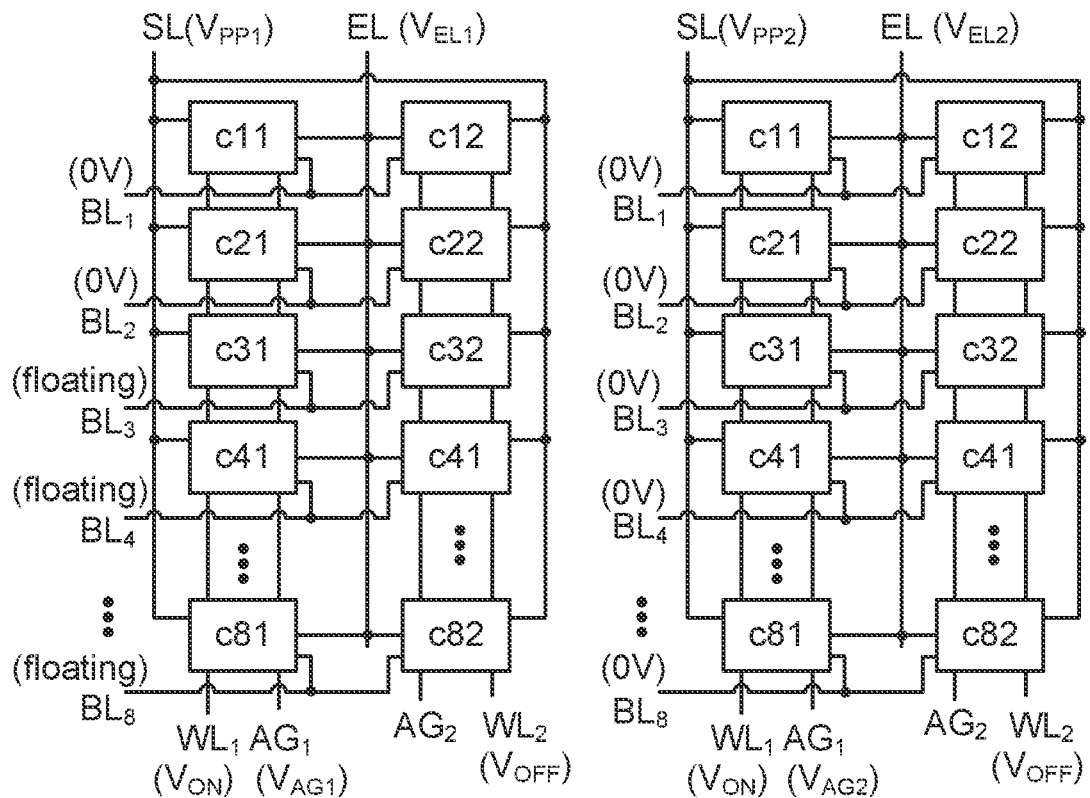
FIGS. 4B and 4C are schematic circuit diagrams illustrating the bias voltages of performing a byte program action on an array structure by using a programming control method of the present invention.

FIGS. 4B and 4C are schematic circuit diagrams illustrating the bias voltages of performing a byte program action on an array structure by using a programming control method of the present invention. The array structure comprises sixteen memory cells c11~c82 in an 8×2 array arrangement. The structure of each of the sixteen memory cells c11~c82 is identical to the structure of the 2T2C memory cell of the present invention. When the byte program action is performed, it is set that x=8 and y=4. That is, eight memory cells are divided into four groups, and each group contains two memory cells. When the byte program action is performed, four (i.e., y=4) weak programming procedures are sequentially performed, and then a strong programming procedure is performed.

An exemplary process of performing the byte program action will be described as follows.

When the four weak programming procedures are performed, the source line SL receives the first program voltage $V_{PP1}$, the erase line EL receives the first erase line voltage $V_{EL1}$, the word line $WL_1$ receives the on voltage $V_{ON}$, the assist gate line AG receives the first assist gate voltage $V_{AG1}$, and the word line $W_{L2}$ receives an off voltage $V_{OFF}$. Consequently, the first column of the array structure is a selected column, and the second column of the array structure is an unselected column. The memory cells c12~c82 in the second column are unselected memory cell. For example, the off voltage $V_{OFF}$ is equal to the first program voltage $V_{PP1}$.

Please refer to FIG. 4B. When the weak programming procedure is performed for the first time, the bit lines $BL_1$~$BL_2$ receive the ground voltage (0V), and the other bit lines $BL_3$~$BL_8$ are in the floating state. Consequently, in the memory cells c11~c81 of the selected column, the two memory cells c11 and c21 are selected memory cells, and the other memory cells c31~c81 are unselected memory cells. This weak programming procedure is performed on the two selected memory cells c11 and c21 only, but this weak programming procedure is not performed on the memory cells c31~c81. That is, in the first programming time period, the two selected memory cells c11 and c21 in the first group are subjected to the weak programming procedure.

Similarly, when the weak programming procedure is performed for the second time, the bit lines $BL_3$~$BL_4$ receive the ground voltage (0V), and the other bit lines $BL_1$~$BL_2$ and $BL_5$~$BL_8$ are in the floating state. Consequently, in the first programming time period, the two selected memory cells c31 and c41 in the second group are subjected to the weak programming procedure, but the other memory cells c11~c21 and c51~c81 are not subjected to the weak programming procedure. Similarly, when the weak programming procedure is performed for the third time, the weak programming procedure is performed on the two selected memory cells c51 and c61 only. Similarly, when the weak programming procedure is performed for the fourth time, the weak programming procedure is performed on the two selected memory cells c71 and c81 only.

Please refer to FIG. 4C. When the strong programming procedure is performed, the source line SL receives the second program voltage $V_{PP2}$, the erase line EL receives the second erase line voltage $V_{EL2}$, the word line $WL_1$ receives the on voltage $V_{ON}$, the assist gate line AG receives the second assist gate voltage $V_{AG2}$, the word line $W_{L2}$ receives the off voltage $V_{OFF}$, and the bit lines $BL_1$~$BL_8$ receives the ground voltage (0V). Consequently, the memory cells c11~c81 in the first column are selected memory cells, but the memory cells c21~c82 are unselected memory cells. In the second programming time period, all of the eight selected memory cells in the first column are subjected to the strong programming procedure.

As mentioned above, when the byte program action is performed, four weak programming procedures are sequentially performed on four corresponding groups of memory cells, and then one strong programming procedure is performed on all of the eight memory cells. In other words, it takes four first programming time periods and one second programming time period to perform the byte program action. In case that the first programming time period is 3 μs and the second programming time period is 38 µs, the total programming time period of the byte program action is 50 µs, i.e., 3×4+38=50 (µs).

Of course, the eight memory cells may be divided into more than or less than four groups. For example, in a variant example, eight memory cells are divided into eight groups (i.e., y=8), and each group contains one memory cell. In another variant example, eight memory cells are divided into two groups (i.e., y=2), and each group contains four memory cell. Moreover, the bias voltages provided to the array structure of the present invention are not restricted. That is, the bias voltages for performing the byte program action may be varied according to the practical requirements.

In addition, the weak programming procedure followed by the strong programming procedure in the program action of the present invention can effectively reduce the program disturbance on the unselected memory cells. The following is explained in detail.

As shown in FIG. 4B, during the first weak programming procedure of the program action, the word line $W_{L2}$ receives the off voltage $V_{OFF}$, the memory cells c12 and c22 are unselected memory cells. Since the N-well region NW and the source line SL receive the highest first programming voltage $V_{PP1}$ and the bit lines $BL_1$~$BL_2$ receive the ground voltage (0V), a voltage stress between the N-well region NW and the bit lines $BL_1$~$BL_2$ in the unselected memory cells c12 and c22 is the highest first programming voltage $V_{PP1}$. Under this voltage stress, the N-well region NW may produce a band-to-band tunneling hot electron (BBHE) effect, and electrons maybe injected from the N-well region NW into the floating gates of unselected memory cells c12 and c22, causing program disturbance. However, in the embodiment of the present invention, since the time period of the weak programming procedure is very short, program disturbance can be greatly reduced. Also, applying a lower first erase line voltage $V_{EL1}$ to the erase line EL helps to reduce the program disturbance during the weak programming procedure.

As shown in FIG. 4C, during the strong programming procedure of the program action, the word line $W_{L2}$ receives the off voltage $V_{OFF}$, the memory cells c12~c82 are unselected memory cells. Similarly, the N-well region NW and the source line SL receive the second programming voltage $V_{PP2}$ and the bit lines $BL1$~$BL_8$ receive the ground voltage (0V), a voltage stress between the N-well region NW and the bit lines $BL_1$~$BL_8$ in the unselected memory cells c12~c28 is the second programming voltage $V_{PP2}$. Since the voltage stress (the second program voltage $V_{PP2}$) is lower, the longer time period of the strong programming procedure may not produce the band-to-band tunneling hot electron (BBHE) effect, causing serious program disturbance on the unselected memory cells c12~c28.

Generally, when an erase action is performed on a non-volatile memory, the memory cells in a specific area of the array structure are all erased. For example, in case that the specific area is a block, the erase action is a block erase action. Whereas, in case that the specific area is a page, the erase action is a page erase action. In accordance with the present invention, a specified bias voltage is provided to the assist gate line when the erase action is performed. Consequently, the memory cells in the specified area of the array structure are subjected to erase inhibition.

Figure 5A:
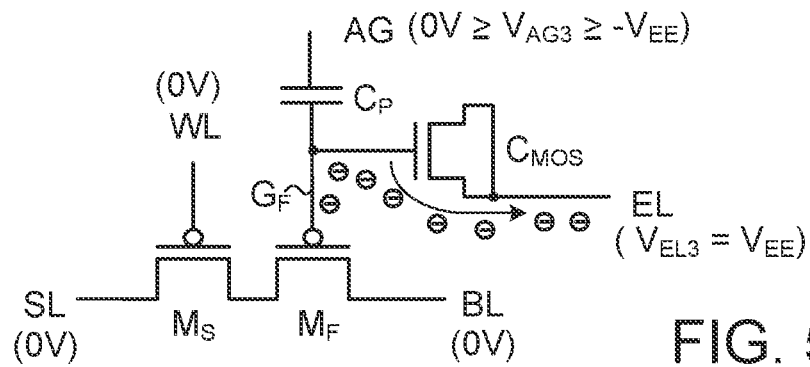
FIGS. 5A and 5B are schematic circuit diagrams illustrating the bias voltages of performing an erase action and an erase inhibition on the 2T2C memory cell of the present invention.
Figure 5B:
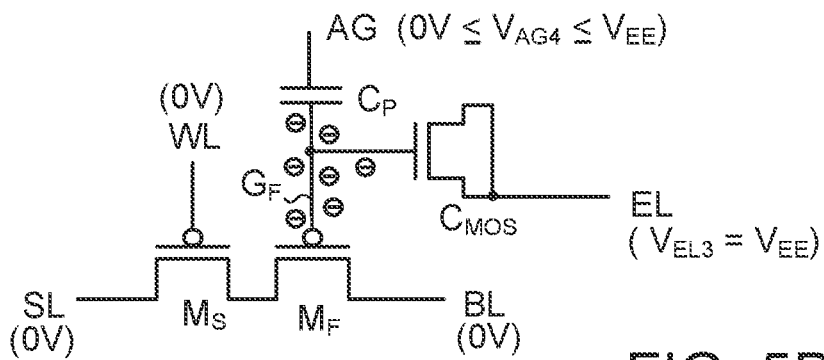

FIGS. 5A and 5B are schematic circuit diagrams illustrating the bias voltages of performing an erase action and an erase inhibition on the 2T2C memory cell of the present invention.

Please refer to FIG. 5A. When the erase action is performed, the ground voltage (0V) is provided to the word line WL, the ground voltage (0V) is provided to the source line SL, the ground voltage (0V) is provided to the bit line BL, a third erase line voltage $V_{EL3}$ is provided to the erase line EL, and a third assist gate voltage $V_{AG3}$ is provided to the assist gate line AG. In addition, the ground voltage (0V) is provided to the N-well region NW, and the ground voltage (0V) is provided to the P-well region PW. For example, the third erase line voltage $V_{EL3}$ is equal to an erase voltage $V_{EE}$, and the third assist gate voltage $V_{AG3}$ is in the range between 0V and the negative value of the erase voltage $V_{EE}$ (i.e., $-V_{EE}$). For example, the erase voltage $V_{EE}$ is 12V.

When the erase action is performed, the third assist gate voltage $V_{AG3}$ is negative, and the third erase line voltage $V_{EL3}$ is equal to the erase voltage $V_{EE}$. Consequently, a Fowler-Nordheim tunneling effect (also referred as a FN tunneling effect) is generated. Due to the FN tunneling effect, electrons are injected from the floating gate $G_F$ of the floating gate transistor $M_F$ to the erase line EL through the MOS capacitor $C_{MOS}$.

Please refer to FIG. 5B. When the erase inhibition is performed, the ground voltage (0V) is provided to the word line WL, the ground voltage (0V) is provided to the source line SL, the ground voltage (0V) is provided to the bit line BL, the third erase line voltage $V_{EL3}$ is provided to the erase line EL, and a fourth assist gate voltage $V_{AG4}$ is provided to the assist gate line AG. In addition, the ground voltage (0V) is provided to the N-well region NW, and the ground voltage (0V) is provided to the P-well region PW. For example, the third erase line voltage $V_{EL3}$ is equal to an erase voltage $V_{EE}$, and the fourth assist gate voltage $V_{AG4}$ is in the range between 0V and the erase voltage $V_{EE}$. The fourth assist gate voltage $V_{AG4}$ for the erase inhibition is higher than the third assist gate voltage $V_{AG3}$ for the erase action.

When the erase inhibition is performed, the FN tunneling effect cannot be generated. Consequently, electrons cannot be injected from the floating gate $G_F$ of the floating gate transistor $M_F$ to the erase line EL.

Figure 6A:
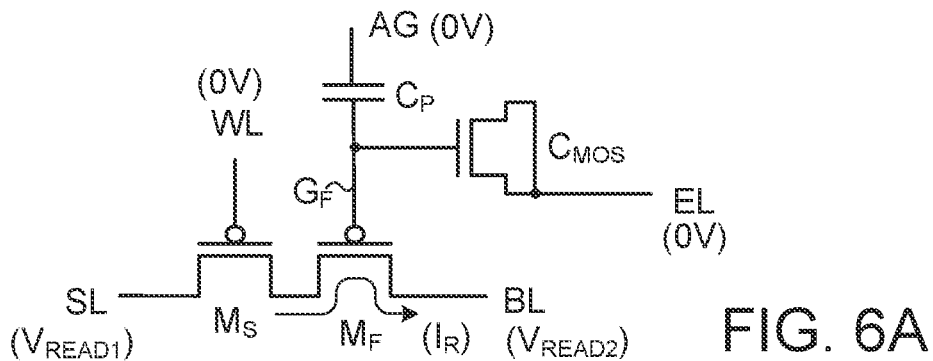
FIGS. 6A and 6B are schematic circuit diagrams illustrating the bias voltages of performing a read action on the 2T2C memory cell of the present invention.
Figure 6B:
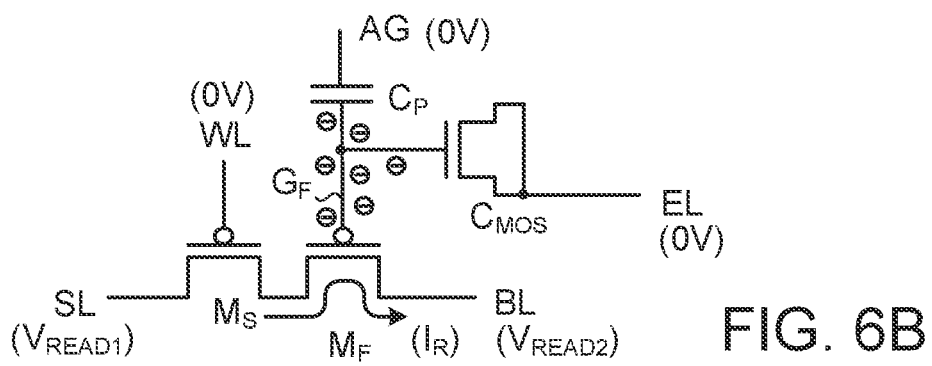

When a read action is performed on the 2T2C memory cell, the storing state of the memory cell can be determined according to the result of judging whether electrons are stored in the floating gate $G_F$ of the floating gate transistor $M_F$. FIGS. 6A and 6B are schematic circuit diagrams illustrating the bias voltages of performing a read action on the 2T2C memory cell of the present invention.

When the read action is performed, the ground voltage (0V) is provided to the word line WL, a first read voltage $V_{READ1}$ is provided to the source line SL, a second read voltage $V_{READ2}$ is provided to the bit line BL, the ground voltage (0V) is provided to the erase line EL, and the ground voltage (0V) is provided to the assist gate line AG. In addition, the first read voltage $V_{READ1}$ is provided to the N-well region NW, and the ground voltage (0V) is provided to the P-well region PW. The first read voltage $V_{READ1}$ is higher than the second read voltage $V_{READ2}$. For example, the first read voltage $V_{READ1}$ is 2.4V, and the second read voltage $V_{READ2}$ is 0.4V.

Since the word line WL receives the ground voltage (0V), the select transistor $M_S$ is turned on, and a read current IR flows from the source line SL to the bit line BL. In the situation of FIG. 6A, no electrons are stored in the floating gate $G_F$ of the floating gate transistor $M_F$. Consequently, the magnitude of the read current $I_R$ is very low (e.g., nearly zero). In the situation of FIG. 6B, electrons are stored in the floating gate $G_F$ of the floating gate transistor $M_F$. Consequently, the magnitude of the read current $I_R$ is higher.

According to the magnitude of the read current $I_R$, the storing state of the memory cell can be determined.

For example, a sensing circuit (not shown) is provided to judge the storing state of the memory cell. The sensing circuit receives a reference current $I_{REF}$ and the read current $I_R$. If the read current $I_R$ is lower than the reference current $I_{REF}$, the sensing circuit judges that the memory cell is in the erase state. Whereas, if the read current $I_R$ is higher than the reference current $I_{REF}$, the sensing circuit judges that the memory cell is in the program state.

It is noted that the voltage values of the first read voltage $V_{READ1}$ and the second read voltage $V_{READ2}$ are not restricted. For example, in another embodiment, the first read voltage $V_{READ1}$ is 2.0V, and the second read voltage $V_{READ2}$ is 0.V.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A control method for a memory cell of a non-volatile memory, the memory cell comprising a select transistor, a floating gate transistor, a first capacitor and a second capacitor, a first drain/source terminal of the select transistor being connected to a source line, a gate terminal of the select transistor being connected to a word line, a first drain/source terminal of the floating gate transistor being connected to a second drain/source terminal of the select transistor, a second drain/source terminal of the floating gate transistor being connected to a bit line, the first capacitor being connected between a floating gate of the floating gate transistor and an erase line, the second capacitor being connected between the floating gate of the floating gate transistor and an assist gate line, the control method comprising steps of:

performing a weak programming procedure of a program action on the memory cell, wherein when the weak programming procedure is performed, the select transistor is turned on, a first program voltage is provided to the source line, a ground voltage is provided to the bit line, a first assist gate voltage is provided to the assist gate line, and a first erase line voltage is provided to the erase line;

performing a strong programming procedure of the program action on the memory cell after the weak programming procedure is completed, wherein when the strong programming procedure is performed, the select transistor is turned on, a second program voltage is provided to the source line, the ground voltage is provided to the bit line, a second assist gate voltage is provided to the assist gate line, and a second erase line voltage is provided to the erase line, wherein the weak programming procedure is performed for a first programming time period, and the strong programming procedure is performed for a second programming time period, wherein the first program voltage is higher than the second program voltage, the first assist gate voltage is lower than the second assist gate voltage, and the first programming time period is shorter than the second programming time period.

2. The control method as claimed in claim 1, wherein the select transistor is turned on when an on voltage is provided to the word line, wherein the first assist gate voltage is lower than or equal to the ground voltage, the first erase line voltage is higher than or equal to the ground voltage, the first erase line voltage is lower than or equal to a half of the first program voltage, the second assist gate voltage is equal to the second program voltage, and the second erase line voltage is equal to a half of the second program voltage.

3. The control as claimed in claim 1, further comprising steps of:

performing an erase action, wherein when the erase action is performed, the ground voltage is provided to the word line, the source line, and the bit line, a third assist gate voltage is provided to the assist gate line, and a third erase line voltage is provided to the erase line; and performing an erase inhibition, wherein when the erase inhibition is performed, the ground voltage is provided to the word line, the source line, and the bit line, a fourth assist gate voltage is provided to the assist gate line, and the third erase line voltage is provided to the erase line, wherein the third erase line voltage is equal to an erase voltage, and the third assist gate voltage is lower than the fourth assist gate voltage.

4. The control method as claimed in claim 3, wherein the third assist gate voltage is lower than or equal to the ground voltage and is higher than or equal to a negative value of the erase voltage, wherein the fourth assist gate voltage is lower than or equal to the erase voltage, and is higher than or equal to the ground voltage.

5. The control as claimed in claim 1, further comprising steps of:

performing a read action, wherein when the read action is performed, the select transistor is turned on, a first read voltage is provided to the source line, a second read voltage is provided to the bit line, the ground voltage is provided to the assist gate line and the erase line; and receiving a read current from the bit line, and determining a storing state of the memory cell according to a magnitude of the read current, wherein the first read voltage is higher than the second read voltage, wherein if the read current is lower than a reference current, the memory cell is determined to be in an erase state, wherein if the read current is higher than the reference current, the memory cell is determined to be in a program state.

6. The control method as claimed in claim 1, wherein the select transistor is a p-type transistor, the floating gate transistor is a p-type floating gate transistor, the first capacitor is a metal-oxide-semiconductor capacitor, and the second capacitor is a plate capacitor.

7. A control method for an array structure of a non-volatile memory, the array structure comprising x memory cells, the x memory cells being divided into y groups, x and y being positive integers larger than 1, x being larger than or equal to y, the control method comprising steps of:

(a) sequentially performing y weak programming procedures of a program action, wherein each of the y weak programming procedures is performed on a corresponding group of the y groups; and (b) after the step (a) is completed, performing a strong programming procedure of the program action on the x memory cells, wherein a first memory of the x memory cells comprises a select transistor, a floating gate transistor, a first capacitor and a second capacitor, wherein a first drain/source terminal of the select transistor is connected to a source line, a gate terminal of the select transistor is connected to a first word line, a first drain/source terminal of the floating gate transistor is connected to a second drain/source terminal of the select transistor, a second drain/source terminal of the floating gate transistor is connected to a first bit line, the first capacitor is connected between a floating gate of the floating gate transistor and an erase line, and the second capacitor is connected between the floating gate of the floating gate transistor and a first assist gate line, wherein when the weak programming procedure is performed on the first memory cell, the select transistor is turned on, a first program voltage is provided to the source line, a ground voltage is provided to the first bit line, a first assist gate voltage is provided to the first assist gate line, and a first erase line voltage is provided to the erase line, wherein when the strong programming procedure is performed on the first memory cell, the select transistor is turned on, a second program voltage is provided to the source line, the ground voltage is provided to the first bit line, a second assist gate voltage is provided to the first assist gate line, and a second erase line voltage is provided to the erase line, wherein each of the y weak programming procedures is performed for a first programming time period, and the strong programming procedure is performed for a second programming time period, wherein the first program voltage is higher than the second program voltage, the first assist gate voltage is lower than the second assist gate voltage, and the first programming time period is shorter than the second programming time period.

8. The control as claimed in claim 7, wherein the step (a) comprises steps of:
(a1) when the program action is started, setting a positive integer variable i as 1;
(a2) performing the weak programming procedure on an i-th group of the y groups;
(a3) if i is not equal to y, adding 1 to i, and performing the step (a2) again; and
(a4) if i is equal to y, performing the step (b).

9. The control method as claimed in claim 7, wherein the select transistor is turned on when an on voltage is provided to the first word line, wherein the first assist gate voltage is lower than or equal to the ground voltage, the first erase line voltage is higher than or equal to the ground voltage, the first erase line voltage is lower than or equal to a half of the first program voltage, the second assist gate voltage is equal to the second program voltage, and the second erase line voltage is equal to a half of the second program voltage.

10. The control as claimed in claim 7, further comprising steps of:
performing an erase action, wherein when the erase action is performed, the ground voltage is provided to the first word line, the source line, and the first bit line, a third assist gate voltage is provided to the first assist gate line, and a third erase line voltage is provided to the erase line; and
performing an erase inhibition, wherein when the erase inhibition is performed, the ground voltage is provided to the first word line, the source line, and the first bit line, a fourth assist gate voltage is provided to the first assist gate line, and the third erase line voltage is provided to the erase line,
wherein the third erase line voltage is equal to an erase voltage, and the third assist gate voltage is lower than the fourth assist gate voltage.

11. The control method as claimed in claim 10, wherein the third assist gate voltage is lower than or equal to the ground voltage and is higher than or equal to a negative value of the erase voltage, wherein the fourth assist gate voltage is lower than or equal to the erase voltage, and is higher than or equal to the ground voltage.

12. The control as claimed in claim 7, further comprising steps of:
performing a read action, wherein when the read action is performed, the select transistor is turned on, a first read voltage is provided to the source line, a second read voltage is provided to the first bit line, the ground voltage is provided to the first assist gate line and the erase line; and
receiving a read current from the first bit line, and determining a storing state of the memory cell according to a magnitude of the read current,
wherein the first read voltage is higher than the second read voltage, wherein if the read current is lower than a reference current, the memory cell is determined to be in an erase state, wherein if the read current is higher than the reference current, the memory cell is determined to be in a program state.

13. The control method as claimed in claim 7, wherein the select transistor is a p-type transistor, the floating gate transistor is a p-type floating gate transistor, the first capacitor is a metal-oxide-semiconductor capacitor, and the second capacitor is a plate capacitor.

* * * * *